United States Patent [19]

Ealey et al.

[11] Patent Number: 4,959,567
[45] Date of Patent: Sep. 25, 1990

[54] MAGNETODISTORTIVE ACTUATOR WITH ADJUSTABLE MAGNETIC BIAS

[75] Inventors: Mark A. Ealey, Ayer, Mass.; Robert L. Lillard, Jupiter, Fla.

[73] Assignee: United Technologies Corporation, Hartford, Conn.

[21] Appl. No.: 286,837

[22] Filed: Dec. 20, 1988

[51] Int. Cl.$^5$ .............................................. G02B 7/18
[52] U.S. Cl. ...................................... 310/26; 335/215; 350/486; 350/611; 350/360
[58] Field of Search ........................ 310/26; 335/215; 318/118; 350/486, 487, 607, 611, 632, 360

[56] References Cited

U.S. PATENT DOCUMENTS

| | | | |
|---|---|---|---|
| 4,585,978 | 4/1986 | Hasselmark et al. | 310/26 |
| 4,703,464 | 10/1987 | Howarth et al. | 310/26 |
| 4,845,450 | 7/1989 | Porzio et al. | 310/26 |
| 4,861,149 | 8/1989 | Ealey | 350/611 |

Primary Examiner—Steven L. Stephan
Assistant Examiner—Judson H. Jones
Attorney, Agent, or Firm—Peter R. Ruzek

[57] ABSTRACT

A magnetodistortive actuator includes an elongated active component of a magnetodistortive material mounted on a support and having a stationary and a movable end portion. At least one permanent magnet applied a permanent magnetic bias to the active component to bring it to a desired point of its stress/field characteristic line. The strength of that portion of the magnetic field of the permanent magnet that acts on the active component is selectively varied by changing the magnetic reluctance of a body that is accommodated in a space interposed between the permanent magnet and the active component. The active component is further subjected to a variable magnetic field generated by a solenoid surrounding the active component, so that the active component is selectively shortened and lengthened around its length corresponding to the desired point, with attendant movement of the movable end portion relative to the support.

11 Claims, 4 Drawing Sheets

MAGNETODISTORTIVE ACTUATOR WITH ADJUSTABLE MAGNETIC BIAS

DESCRIPTION

1. TECHNICAL FIELD

The present invention relates to actuators in general, and more particularly to magnetodistortive actuators, especially such that are to be used for selectively deforming deformable mirrors.

2. BACKGROUND ART

There are already known various constructions of actuators, among them such that can be used for selectively deforming deformable mirrors, such as those to be used in reflecting high-intensity laser beams, for instance In the latter application, a battery or array of such actuators is being used, such actuators being arranged next to one another in a predetermined pattern, acting on associated aligned portions of the mirror structure, and being individually energized in such a manner as to give the mirror the desired spatial configuration.

In recent years, considerable achievements have been accomplished in the development and perfection of magnetodistortive actuators, especially for the use in the above-mentioned environment. The currently used magnetodistortive actuators or actuator arrays address many of the technical and engineering issues associated with utilizing such actuators in the construction of high spatial and temporal frequency deformable mirror assemblies. So, for instance, the development of magnetodistortive materials with higher magnetostrains and increased sensitivity rendered possible the use of magnetodistortive actuators in high packing density deformable mirror assemblies by greatly reducing solenoidal requirements. Actuator precision was improved by implementing induction feedback compensation and individual actuator closed loop control. Demagnetization effects such as field fringing and self-demagnetization were reduced by employing a closed magnetic circuit design. Linear, open loop actuator response was attained by using electronic drivers employing digital look-up table techniques. Actuator electronic driver design was optimized by employing a scalable, modular approach using low-voltage, solid state components with attendant reduction in the packing volume and power requirements. Actuator thermal growth was compensated for by implementing active liquid cooling, matching material thermal expansion, and providing additional stroke margin for residual axial thermal growth.

Another problem already addressed in the past in conjunction with magnetodistortive actuators was the actuator response to the applied electromagnetic field. To promote the linearity of the actuator response and to enable the actuator to operate in a push-pull fashion, it was proposed to arrange at least one permanent magnet in the vicinity of the magnetodistortive active component, such as at least at one end of such active component, for the permanent magnet to subject the active component to a bias, so that the electromagnetic field applied by the solenoid to the active component causes the latter to lengthen or shorten, depending on the direction of the applied electromagnetic field, relative to its normal length which depends on the magnitude of the permanent bias. However, experience has shown that, because of differences in actuator mounting and associated mechanical loading, in manufacturing tolerances of the various parts of the actuator, and the like, the active component is rarely prestressed to the desired operating point on the stress/field characteristic line when using a constant magnetic pre-bias.

Accordingly, it is a general object of the present invention to avoid the disadvantages of the prior art.

More particularly, it is an object of the present invention to provide a magnetodistortive actuator which does not possess the disadvantages of the known actuators of this kind.

Still another object of the present invention is to develop the magnetodistortive actuator of the type here under consideration in such a manner as to be able to adjust the magnetic pre-bias that is applied to the active component.

It is yet another object of the present invention to devise an actuator the above type which would render it possible to change the operating point of the active component after the actuator has been installed, such as in a mirror assembly A concomitant object of the present invention is to design the actuator of the above type in such a manner as to be relatively simple in construction, inexpensive to manufacture, easy to use, and yet reliable in operation.

DISCLOSURE OF THE INVENTION

In keeping with these objects and others which will become apparent hereafter, one feature of the present invention resides in a magnetodistortive actuator which comprises an elongated active component of a magnetodistortive material mounted on a support and having a stationary and a movable end portion and means for applying a permanent magnetic bias to the active component to bring the latter to a desired point of its stress/field characteristic line. According to the invention, the applying means includes at least one permanent magnet and means for selectively varying the strength of that portion of the magnetic field of the permanent magnet that acts on the active component. The actuator of the present invention further includes means for subjecting the active component to a variable magnetic field to selectively shorten and lengthen the active component around its length corresponding to the desired point, with attendant movement of the movable end portion relative to the support, the subjecting means including a solenoid coil mounted on the support and surrounding the active component and means for supplying electric power to the solenoid coil to energize the same.

BRIEF DESCRIPTION OF THE DRAWING

The present invention will be described in more detail below with reference to the accompanying drawing in which.

BEST MODE FOR CARRYING OUT THE INVENTION

Figure 1:
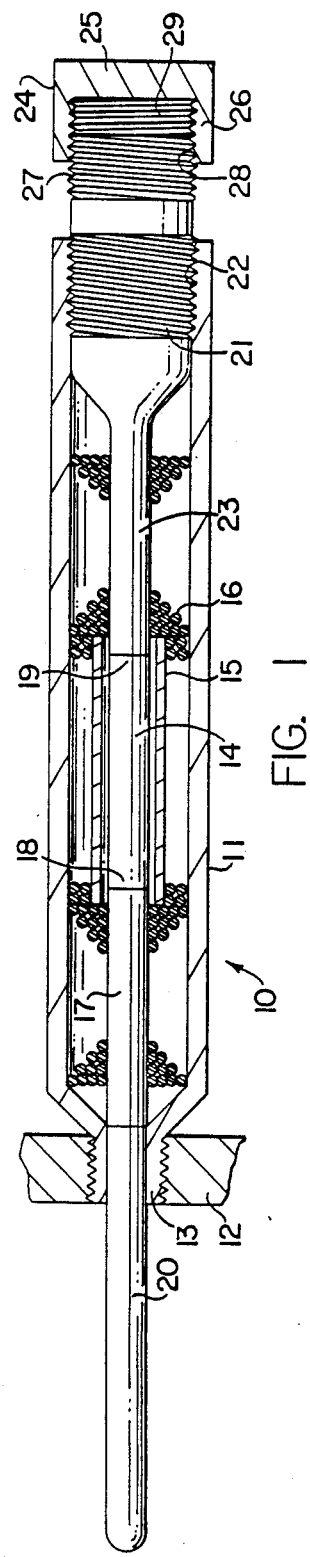
FIG. 1 is an axial sectional view of a magnetodistortive actuator embodying the present invention and including a magnetostrictive core and an axially adjustable permanent magnet.

Referring now to the drawing in detail, and first to FIG. 1 thereof, it may be seen that the reference numeral 10 has been used therein to identify a magnetodistortive actuator constructed in accordance with the present invention. The actuator 10 includes a tubular carrier or housing 11 which serves as a support for the other components of the actuator 10 and which is mounted on a supporting structure 12 by means of an externally threaded portion 13.

The other components of the actuator 10 include an active component 14, a sleeve 15 surrounding the active component 14 and extending axially beyond it, an only diagrammatically indicated solenoid coil 16 arranged around the sleeve 15 and extending axially beyond it within the confines of the carrier 11, a magnetic pole 17 arranged in axial alignment with and connected (such as by a solder or epoxy joint) to a movable end 18 of the active component 14, and a pushrod 20 connected (such as a brazed joint) to and axially aligned with the magnetic pole 17. Such other components of the actuator 10 further include, in accordance with the present invention, a threaded adjuster 21 which is connected to the carrier 11 by a threaded connection 22 and includes an extension 23 which passes through the center of the solenoid 15 in axial alignment with a stationary end portion 19 of the active component 14 and is connected (such as by a solder or epoxy joint) to the active component end portion 19, and a cup-shaped permanent magnet bias adjuster 24 which has an end wall 25 and an annular circumferential wall 26 which is rigidly connected with the end wall 25, surrounds a portion 27 of the threaded adjuster 21, and is connected to the portion 27 by a threaded connection 28.

The active component or core 14 is fabricated from a magnetodistortive material, advantageously from a rare-earth/iron alloy (TbDyFe) developed and produced by Ames Laboratories at Iowa State University and commercially available under the designation Terfenol DZ. It will be appreciated that, because of the above-described construction of the actuator 10, the magnetodistortive core 14 is acted upon in the course of operation of the actuator 10 by varied and varying magnetic fields the superimposition of which results in the axial expansion and contraction (or lengthening and shortening) of the magnetodistortive core 14, depending on the instantaneous density of that portion of the magnetic flux which is permitted to reach the magnetodistortive core 14.

More particularly, the magnetic circuit in which the active component 14 is incorporated features both a D. C. permanent magnetic bias and an A. C. electromagnetic solenoidal drive. The D. C. permanent magnetic bias includes that generated by the sleeve or sheath 15 which is made of a permanently magnetized neodymium/iron/boron material. The A. C. drive magnetic circuit is comprised of the magnetic pole 17 and the threaded adjuster 21 inclusive of its extension 23 which are made of a soft magnetic material, such as that commercially available under the designation Permendur 49 and are arranged next to the end portions 18 and 19 of the active component 14 to constitute respective pole pieces which minimize demagnetization, the carrier 11 which is also made of a soft magnetic material, such as that mentioned above and which completes the magnetic circuit closure, and the solenoid 15 which generates the electromagnetic driving field and which encloses the entire active core region including at least portions of the pole pieces 17 and 23.

The mechanical or structural force train of the actuator 10 includes the carrier or actuator housing 11 which serves as the actuator attachment element, the threaded adjuster 21 which serves as a coarse positional adjustment element (and also, in a non-illustrated manner, as a coolant flow director), and the active assembly which is composed of the active core 14, the magnetic pole 17, and the pushrod 20 which may be made, for instance, of molybdenum. It may be seen that, because of the connection or joint between the extension 23 and the end portion 19, the end portion 19 of the active component 14 will be stationary relative to the carrier or support 11 after the threaded adjuster 21 has been turned into its final position. On the other hand, the lengthening and shortening of the active component 14 will be reflected in a corresponding axial movement of the movable end portion 18 of the active component 14 and, because of the joints between the end portion 18, the magnetic pole 17, and the pushrod 20, in a commensurate axial movement of the pushrod 20.

The adjustable magnetodistortive actuator 10 according to the present invention further includes a "flux bias tuner" which makes the actuator 10 magnetically tunable. This flux bias tuner includes the permanent magnet 24 which is preferably made of a permanently magnetized neodymium/iron/boron material and which is threaded onto the portion 27 of the threaded adjuster 21 to an extent which can be freely selected, within certain limits.

The basic operating principle of the flux bias tuner involves the transport of the magnetic flux from the permanent magnet 24 through the soft magnetic steel adjuster 21 to the magnetodistortive or magnetostrictive active component or core 14. With respect to the magnetodistortive active component 14, the magnetic flux emanating from the permanent magnet 24 is additive to the constant flux generated by the concentric sleeve or bias sheath 15.

More particularly, the cup-shaped configuration of the permanent magnet 24, coupled with the presence of the threaded connection 28, renders it possible not only to create an axial gap or space 29 between the end face of the adjuster portion 27 and the permanent magnet end wall 25, but also to change the axial dimension of this gap 29 to the desired extent. The gap 29 contains a body of a material exhibiting relatively low magnetic permeability, be it air, cooling liquid or other material, and thus any change in the axial dimension of the gap 29 results in a corresponding change (increase or decrease) in the overall magnetic reluctance of the aforementioned body, depending on whether the axial dimension of the gap 29 is decreased or increased by turning the permanent magnet 24 in one sense or the other.

Figure 2:
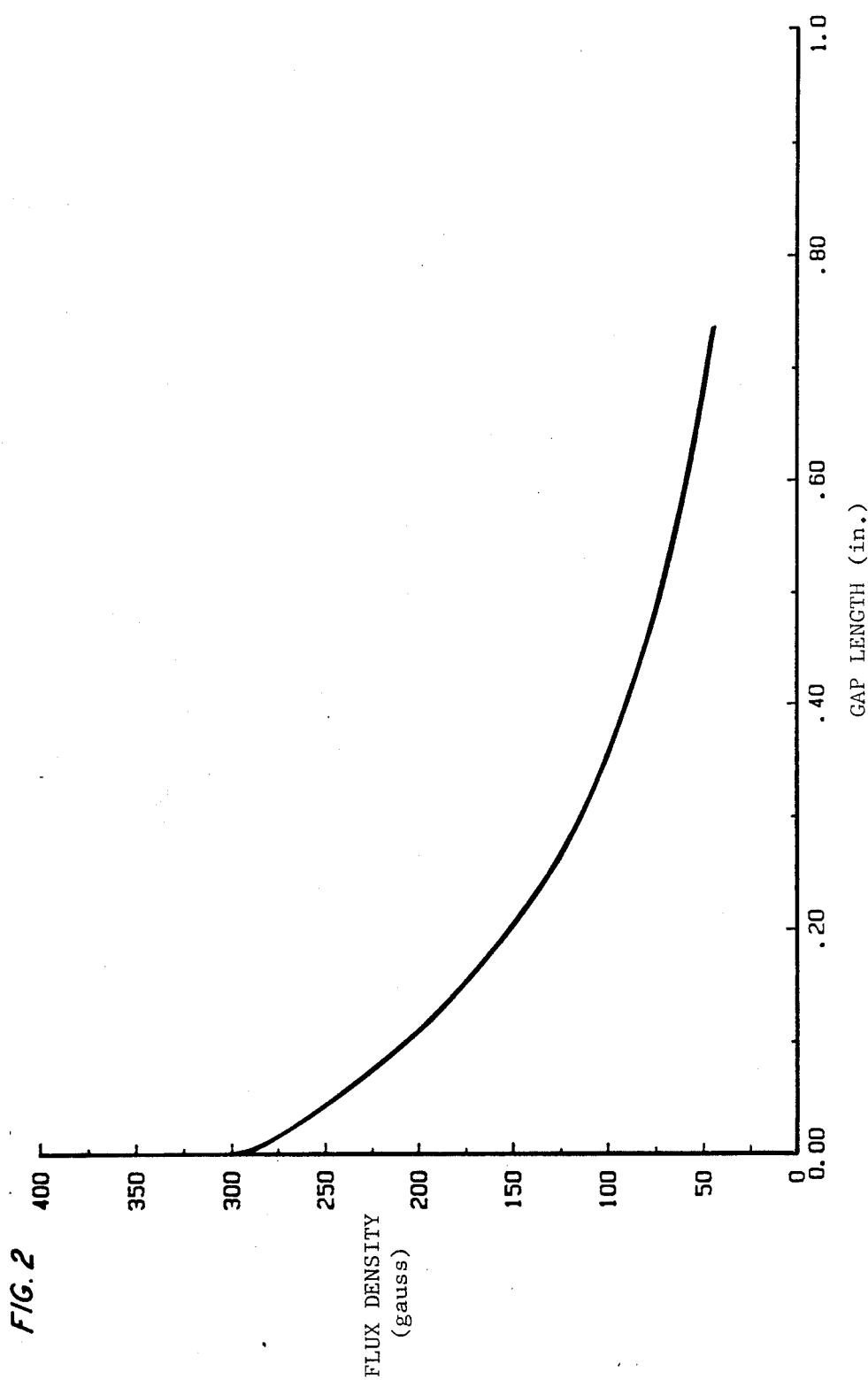
FIG. 2 is a graphic representation of the additive effect of the transported magnetic flux emanating from the axially adjustable permanent magnet of the present invention as depicted in FIG. 1 with respect to a constant permanent magnet bias acting on the core.

The additive effect of the magnetic flux emanating from the permanent magnet 24 with respect to the constant field generated by the sheath 15 is diagrammatically illustrated in FIG. 2 of the drawing as a function of the axial dimension or length of the gap 29. The magnitude of the total flux determines the bias point (on the stress/field line) for the magnetostrictive core 14. It is the control of the magnitude of this additive flux that presents the capability to tune the magnetic bias circuit and maneuver the bias point of the magnetostrictive material. There are two important design features that contribute to the operation of the flux bias tuner, namely the volume (or, more accurately, the configuration) of the permanent magnet 24 and the axial length of the gap 29. The volume and/or configuration of the permanent magnet 24 determines the total amount of magnetic flux that is generated by the magnet 24 and made available for transport through the magnetically soft steel of the adjuster 21 to the core 14. On the other hand, the dimensions and particularly the axial dimension of the gap 29 determine the total amount of the thus generated flux that is actually transported to the core 14.

Figure 3:
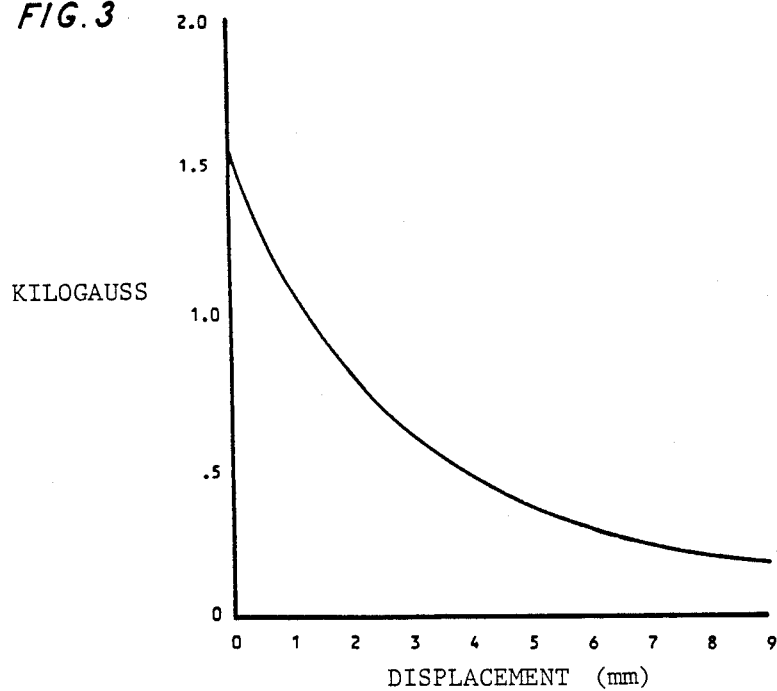
FIG. 3 is a view similar to that of FIG. 2 but showing the dependence of the transported flux density on the axial position of the permanent magnet.
Figure 4:
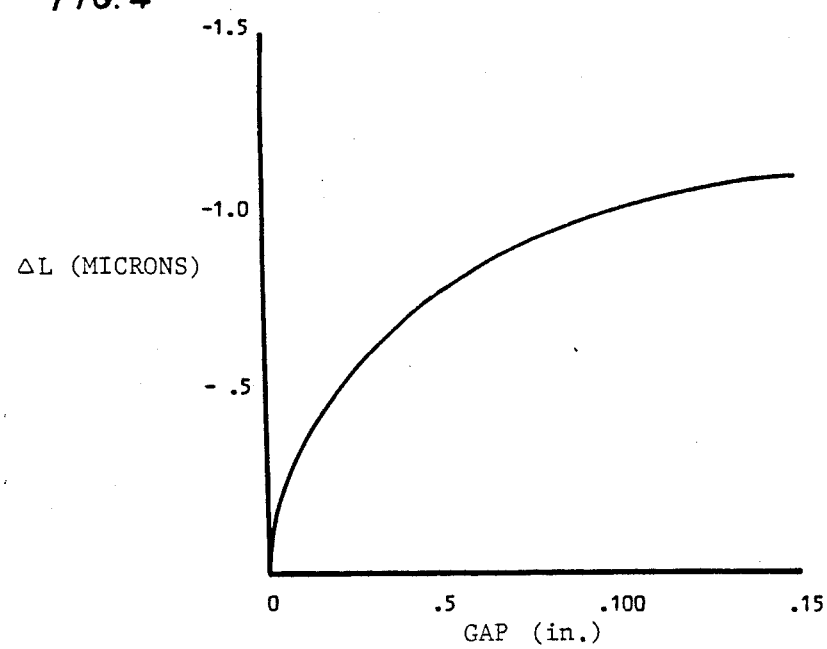
FIG. 4 is a graphic representation of the dependence of the axial length of the core on the axial position of the permanent magnet.

FIG. 3 depicts, in a diagrammatic fashion, the dependence of the transported flux density on the axial dimension of the gap or space 29. It may be seen there that the reluctance of the transport magnetic circuit varies with the size of the gap 29. Inasmuch as the gap 29 (or the body of air or other fluid contained therein) constitutes the part of the transport circuit having the highest reluctance, and the permeability of the magnetostrictive core 14 is low, a relatively large adjustment of the axial gap length results in a relatively small amount of change in the axial dimension of the magnetostrictive core 14. This is shown in FIG. 4 of the drawing which represents a graphic depiction of data obtained by measuring the dependence of the change ($\Delta L$) in the axial dimension of the magnetostrictive core 14 on the axial dimension of the gap 29. It is to be noted that small displacements of the permanent magnet 24 result in much smaller shifts in the magnetic bias point of the core 14, so that the strain/field curve of the actuator remains virtually the same. Since sub-micron resolution is easily obtained in the core 14 when using the magnetic bias flux tuner of the present invention, there is no need for using fine pitch threads which are expensive and susceptible to galling.

Figure 5:
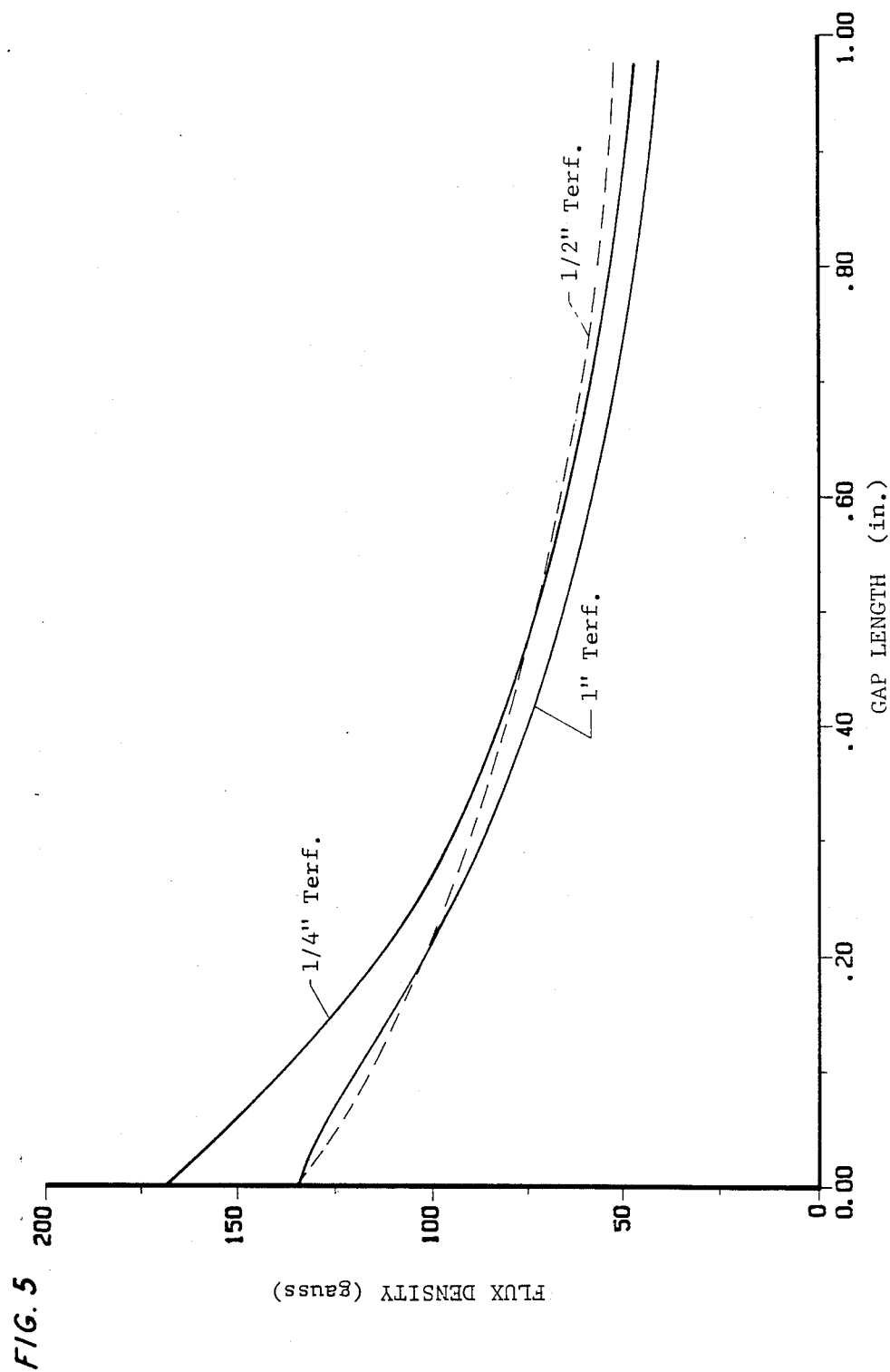
FIG. 5 is a graph depicting the dependence of the flux coupling to the core on the axial position of the permanent magnet for three different actuator constructions.

FIG. 5 of the drawing illustrates the flux transport through the magnetostrictive core or active component 14 as a function of the axial dimension of the gap 29, for three different actuator constructions using cores 14 of different lengths. As expected, the flux coupling through the magnetostrictive cores 14 is a strong function of the axial gap dimension, that is, relatively large adjustment in the axial gap dimension results in a relatively small change in the axial length of the magnetostrictive core 14.

While the present invention has been illustrated and described as embodied in a particular construction of a magnetodistortive actuator, it will be appreciated that the present invention is not limited to this particular example; rather, the scope of protection of the present invention is to be determined solely from the attached claims.

We claim:

1. A magnetodistortive actuator comprising a support;

an elongated active component of a magnetodistortive material mounted on said support and having a stationary and a movable end portion;

electromagnetic means for subjecting said active component to a variable magnetic field to selectively shorten and lengthen said active component with attendant movement of said movable end portion relative to said support, including a solenoid coil mounted on said support and surrounding said active component and means for supplying electric power to said solenoid coil to energize the same; and adjustable permanent magnet means separate from said electromagnetic means for applying a permanent magnetic bias to said active component to bring the latter to a desired point of a stress/field characteristic line independently of the action of said electromagnetic means on said active component, including at least one permanent magnet and means for selectively varying the strength of that portion of the magnetic field of said permanent magnet that acts on said active component even in the absence of energization of said solenoid coil.

2. The actuator as defined in claim 1, wherein said applying means is situated in an aligned position at said stationary end portion and to the opposite axial side thereof from said movable end.

3. The actuator as defined in claim 2, wherein said selectively varying means includes means for defining a space situated between said permanent magnet and said active component, a body exhibiting relatively low magnetic permeability accommodated in said space, and means for changing the magnetic reluctance of said body.

4. The actuator as defined in claim 3, wherein said changing means includes means for mounting said permanent magnet for axial movement relative to said support with attendant change in the axial dimension of said space.

5. The actuator as defined in claim 4, wherein said mounting means includes a threaded connection.

6. The actuator as defined in claim 3, wherein said applying means further includes an intervening element of soft magnetic material interposed between said permanent magnet and said stationary end portion of said active component.

7. The actuator as defined in claim 6, wherein said intervening element is mounted so as to be stationary relative to said stationary end portion; wherein said space is disposed between said permanent magnet and said intervening element; and wherein said changing means includes means for mounting said permanent magnet on said intervening element for axial movement relative thereto with attendant change in the axial dimension of said space.

8. The actuator as defined in claim 7, wherein said mounting means includes a threaded connection.

9. The actuator as defined in claim 8, wherein said permanent magnet is cup-shaped and includes an end wall and an annular wall rigid with said end wall and surrounding a portion of said intervening element, at least said end wall being of a permanently magnetic material; and wherein said threaded connection includes an external thread on said portion of said intervening element and a compatible internal thread on said annular wall of said permanent magnet.

10. A magnetodistortive actuator comprising a support;

an elongated active component of a magnetodistortive material mounted on said support and having a stationary and a movable end portion;

means for applying a permanent magnetic bias to said active component to bring the latter to a desired point of a stress/field characteristic line, said applying means being situated in an aligned position at said stationary end portion and to the opposite axial side thereof from said movable end portion and including at least one permanent magnet and means for selectively varying the strength of that portion of the magnetic field of said permanent magnet that acts on said active component; and means for subjecting said active component to a variable magnetic field to selectively shorten and lengthen said active component around its length corresponding to said desired point, with attendant movement of said movable end portion relative to said support, including a solenoid coil mounted on said support and surrounding said active component and means for supplying electric power to said solenoid coil to energize the same.

11. A magnetodistortive actuator comprising
a support;
an elongated active component of a magnetodistortive material mounted on said support and having a stationary and a movable end portion;

means for applying a permanent magnetic bias to said active component to bring the latter to a desired point of a stress/field characteristic line, said applying means being situated in an aligned position at one of said end portions and to the opposite axial side thereof from the other of said end portions and including at least one permanent magnet and means for selectively varying the strength of that portion of the magnetic field of said permanent magnet that acts on said active component; and means for subjecting said active component to a variable magnetic field to selectively shorten and lengthen said active component around its length corresponding to said desired point, with attendant movement of said movable end portion relative to said support, including a solenoid coil mounted on said support and surrounding said active component and means for supplying electric power to said solenoid coil to energize the same.

* * * * *